(12) United States Patent
Shimizu

(10) Patent No.: US 9,761,306 B1
(45) Date of Patent: Sep. 12, 2017

(54) RESISTIVE MEMORY DEVICE AND METHOD OF PROGRAMMING THE SAME

(71) Applicant: KABUSHIKI KAISHA TOSHIBA, Minato-ku, Tokyo (JP)

(72) Inventor: Naoki Shimizu, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/265,741

(22) Filed: Sep. 14, 2016

Related U.S. Application Data

(60) Provisional application No. 62/305,469, filed on Mar. 8, 2016.

(51) Int. Cl.
  *G11C 11/56* (2006.01)
  *G11C 13/00* (2006.01)
  *G11C 11/16* (2006.01)

(52) U.S. Cl.
  CPC ............ *G11C 11/56* (2013.01); *G11C 11/161* (2013.01); *G11C 11/1673* (2013.01); *G11C 11/1675* (2013.01); *G11C 13/004* (2013.01); *G11C 13/0007* (2013.01); *G11C 13/0026* (2013.01); *G11C 13/0028* (2013.01); *G11C 13/0069* (2013.01); *G11C 2013/0042* (2013.01); *G11C 2013/0078* (2013.01)

(58) Field of Classification Search
  CPC . G11C 13/0069; G11C 11/56; G11C 13/0007; G11C 11/1675; G11C 11/161; G11C 11/1673; G11C 13/004; G11C 13/0026; G11C 13/0028; G11C 2013/0042; G11C 2013/0078
  See application file for complete search history.

(56) References Cited

U.S. PATENT DOCUMENTS

| 6,519,715 | B1 | 2/2003 | Takashi et al. | |
|---|---|---|---|---|
| 2009/0010039 | A1* | 1/2009 | Tokiwa | G11C 13/0007 365/148 |
| 2009/0040817 | A1* | 2/2009 | Kang | G11C 11/56 365/163 |
| 2012/0117418 | A1 | 5/2012 | Gilbert | |
| 2012/0127788 | A1* | 5/2012 | Chung | G11C 11/16 365/158 |
| 2012/0201077 | A1* | 8/2012 | Nagao | G11C 11/5628 365/185.03 |
| 2014/0241037 | A1 | 8/2014 | Kobayashi et al. | |

* cited by examiner

*Primary Examiner* — J. H. Hur
*Assistant Examiner* — Ajay Ojha
(74) *Attorney, Agent, or Firm* — Holtz, Holtz & Volek PC

(57) ABSTRACT

A semiconductor memory device contains a first memory cell including a first variable resistive element, and a first circuit for controlling a write performed for the first memory cell. The first circuit performs a first write for writing first data in the first memory cell in a first time, determines whether the first write fails or not, and performs a second write for writing the first data in the first memory cell in a second time longer than the first time, if the first write fails.

18 Claims, 19 Drawing Sheets

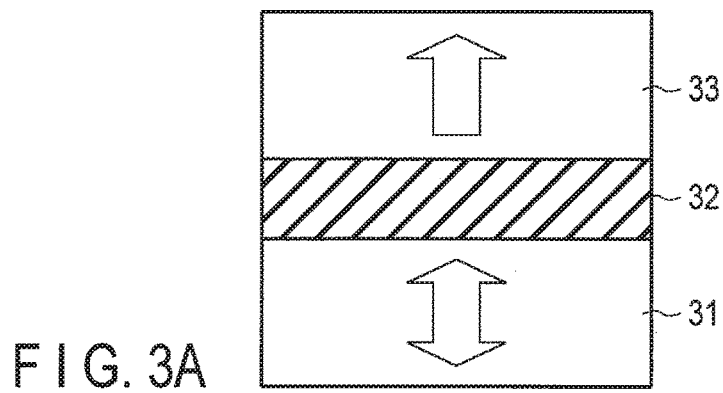
F I G. 3A
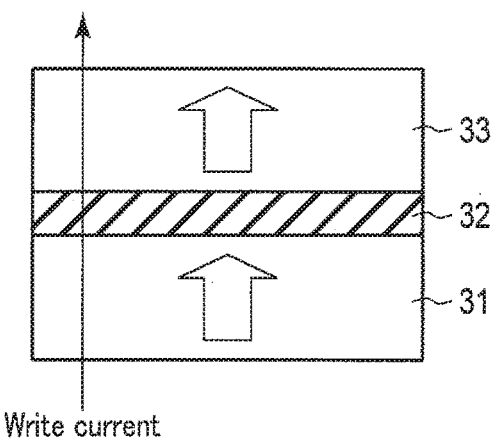
Write current
F I G. 3B   Parallel state (low resistance)
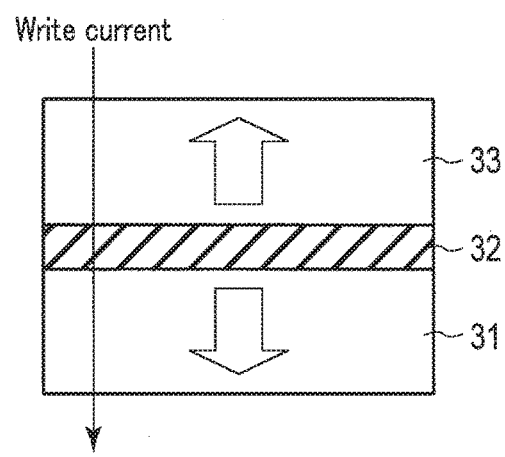
F I G. 3C   Anti-parallel state (high resistance)

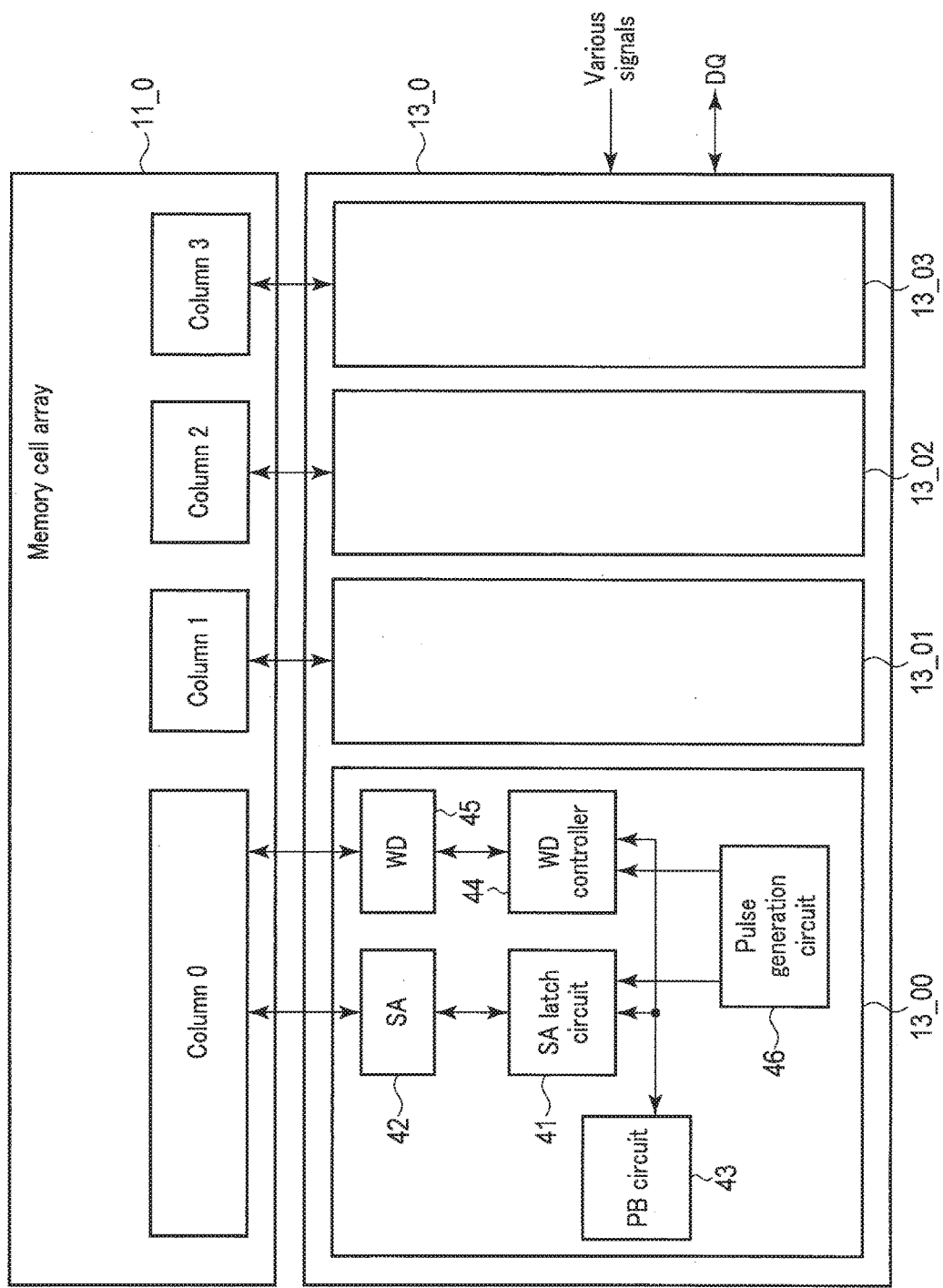
F I G. 4

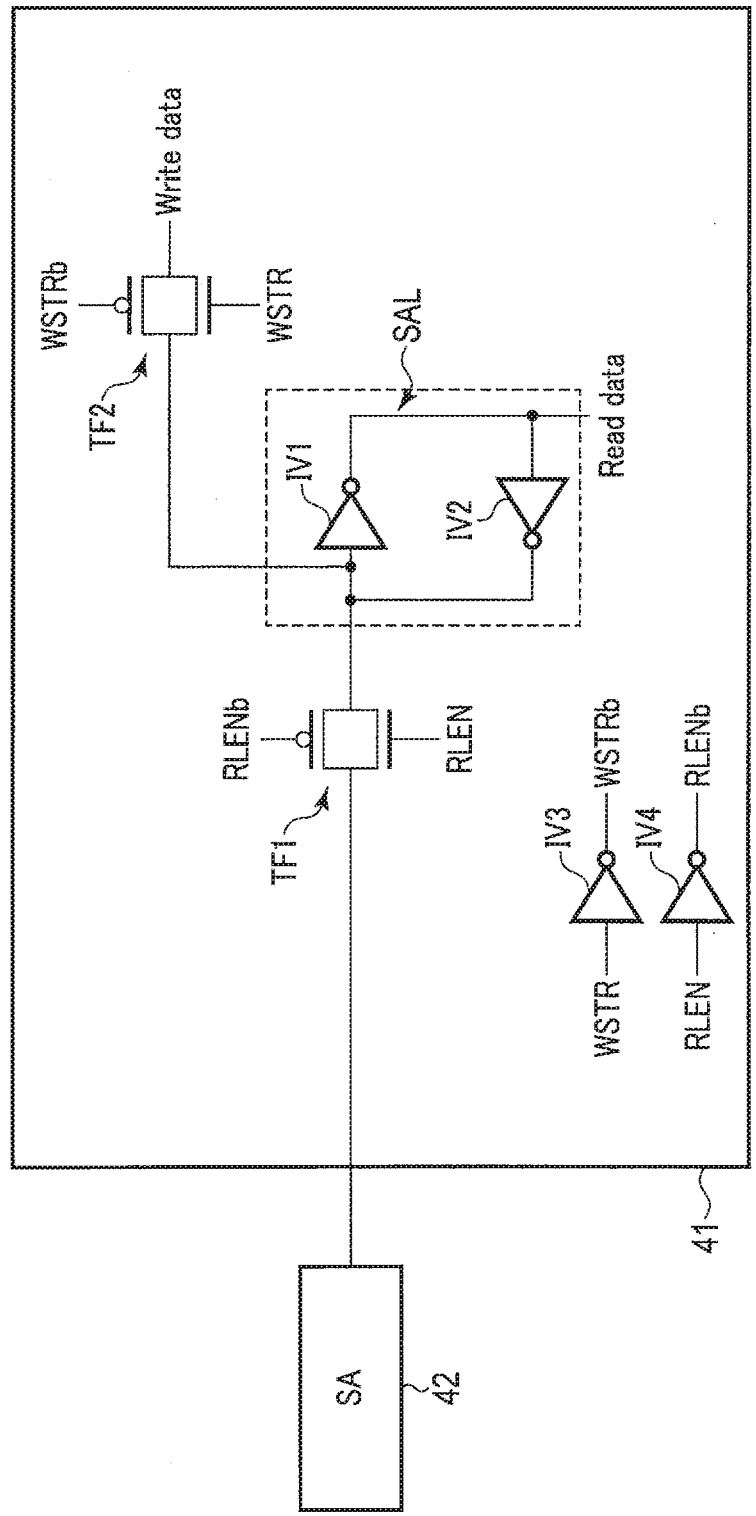
F I G. 5

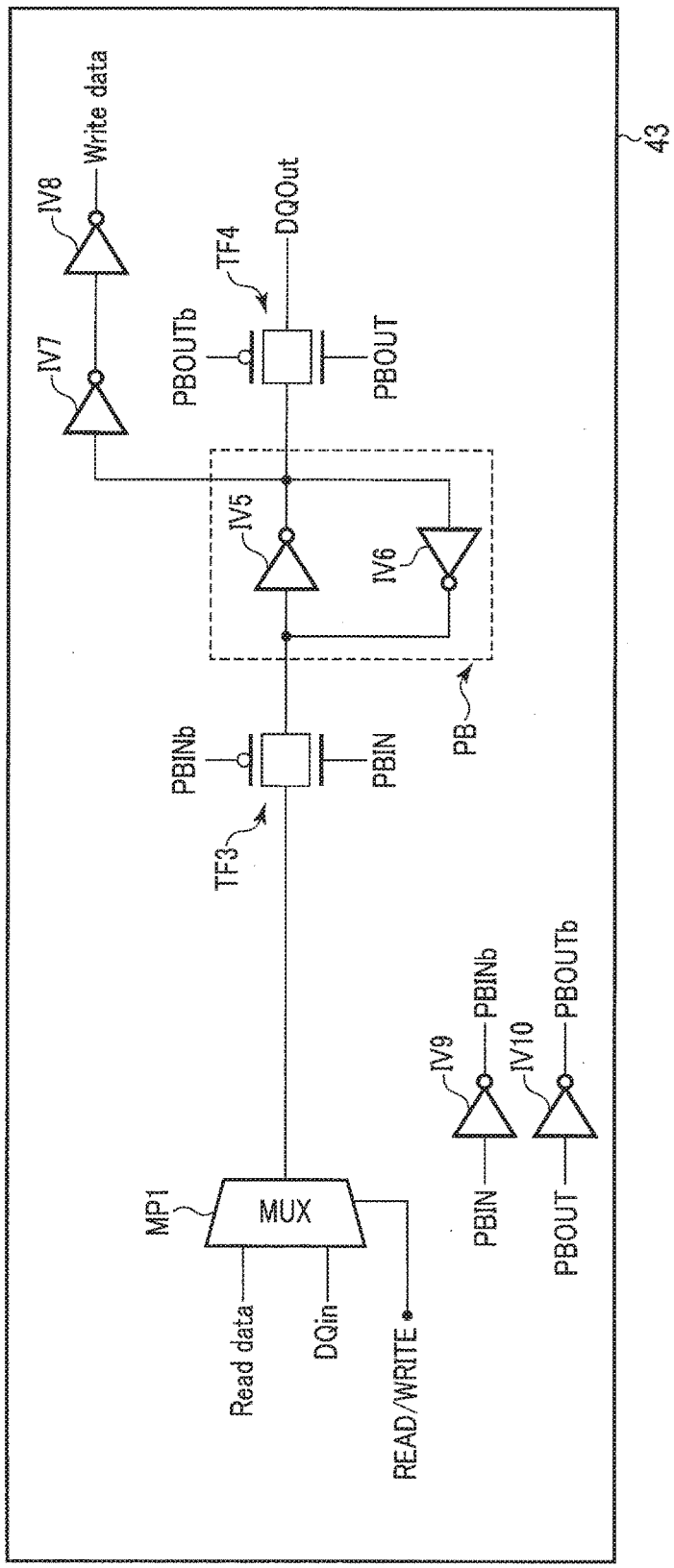
F I G. 6

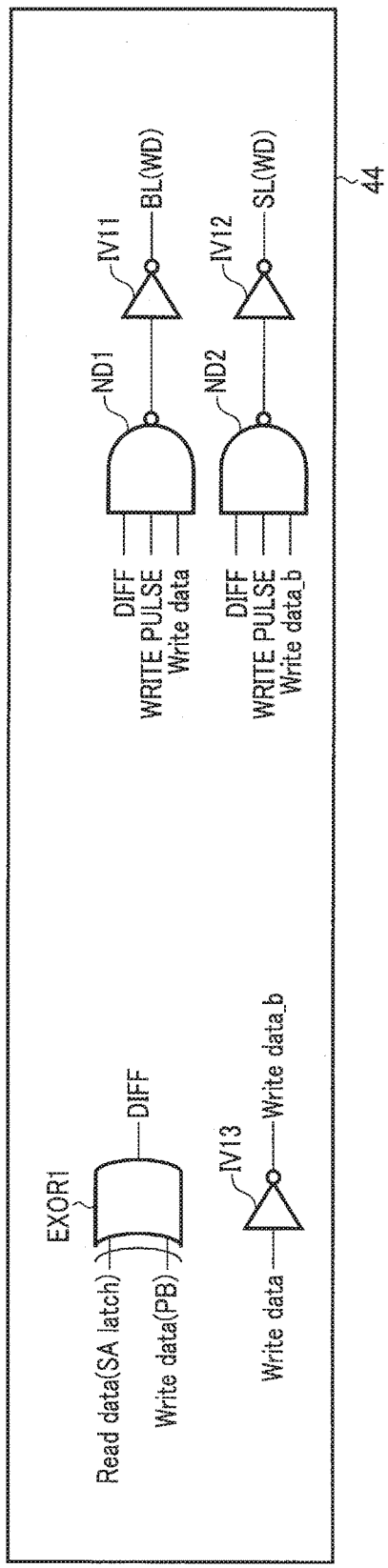
F I G. 7

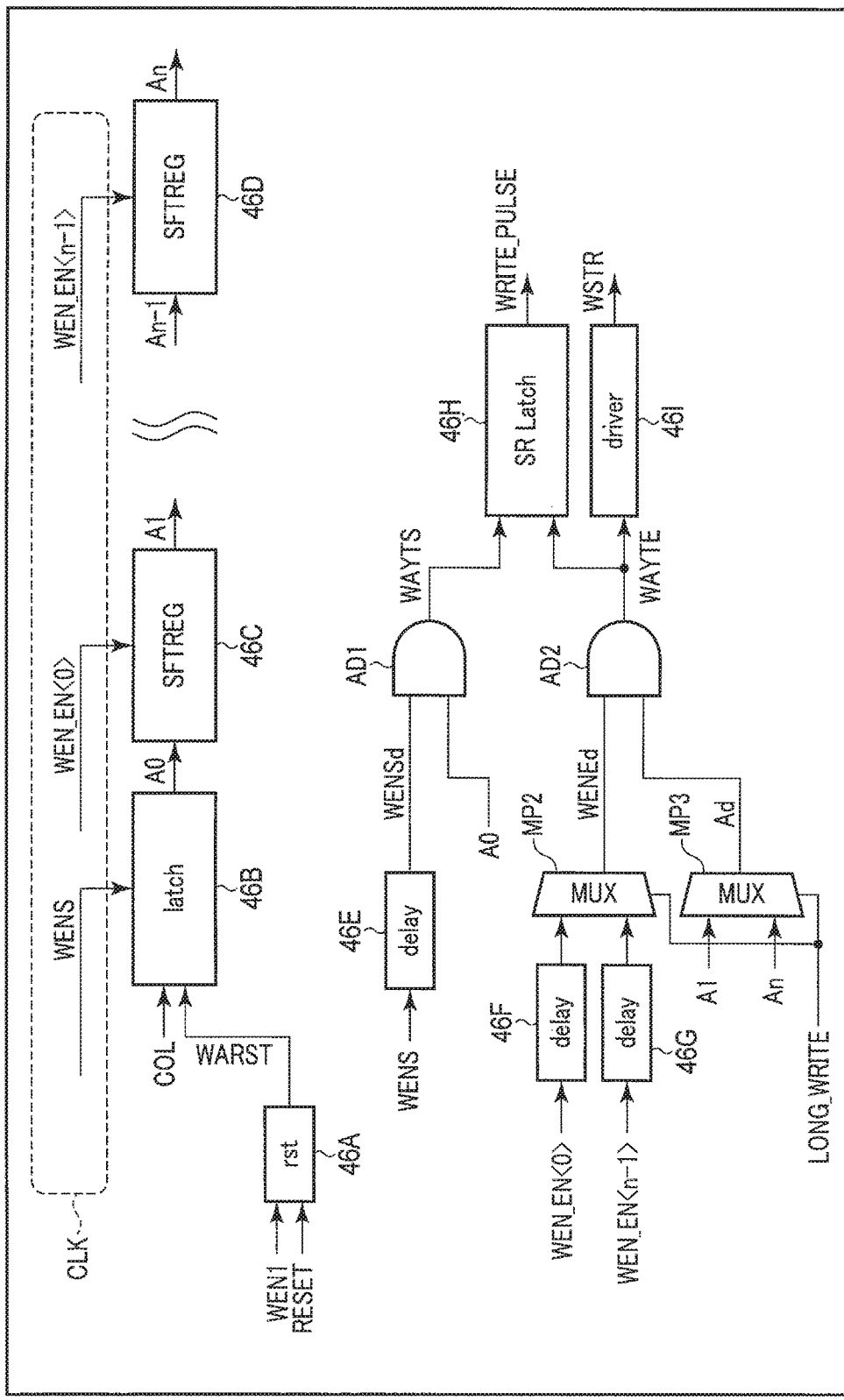
F I G. 8

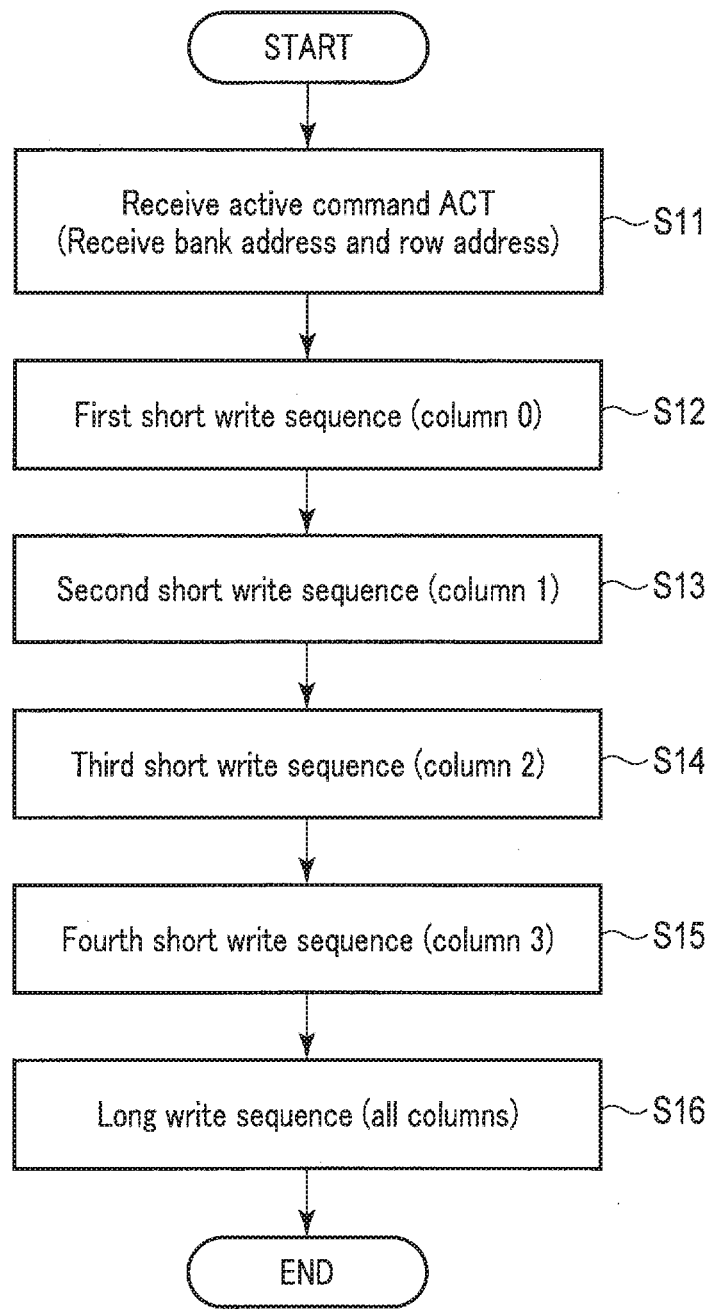
F I G. 11

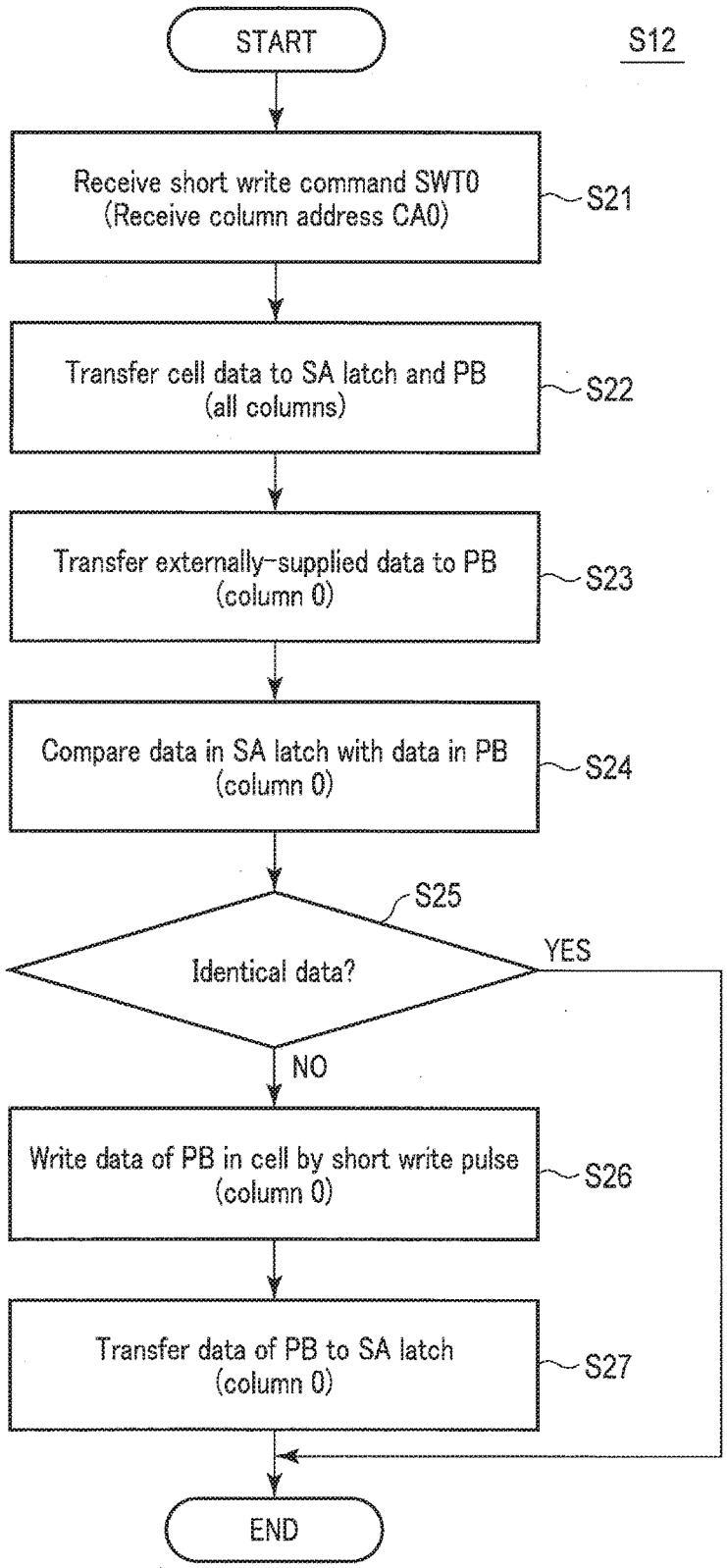
F I G. 12

S22

|  | Column 0 | Column 1 | Column 2 | Column 3 |
|---|---|---|---|---|
| Cell | ● | ○ | ● | ○ |
| SA latch | ● | ○ | ● | ○ |
| PB | ● | ○ | ● | ○ |

F I G. 13

S23~S26 Column 0

|  | Column 0 |  |  |  |
|---|---|---|---|---|
| Cell | ○ | – | – | – |
| SA latch | ● | – | – | – |
| PB | ○ | – | – | – |
| DQ | ○ | – | – | – |

S27 Column 0

|  | Column 0 |  |  |  |
|---|---|---|---|---|
| SA latch | ○ | – | – | – |

F I G. 14

S42

|  | Column 0 | Column 1 | Column 2 | Column 3 |
|---|---|---|---|---|
| Cell | ○ | ○ | ● | ○ |
| SA latch | ○ | ○ | ● | ○ |
| PB | -- | -- | -- | -- |

|  | Column 0 | Column 1 | Column 2 | Column 3 |
|---|---|---|---|---|
| Cell | ○ | ● | ● | ○ |
| SAMP latch | ○ | ○ | ● | ○ |
| PB | ○ | ● | ● | ○ |
| DQ | don't care | | | |

S46

|  | Column 0 | Column 1 | Column 2 | Column 3 |
|---|---|---|---|---|
| SAMP latch | ○ | ● | ● | ○ |

FIG. 20

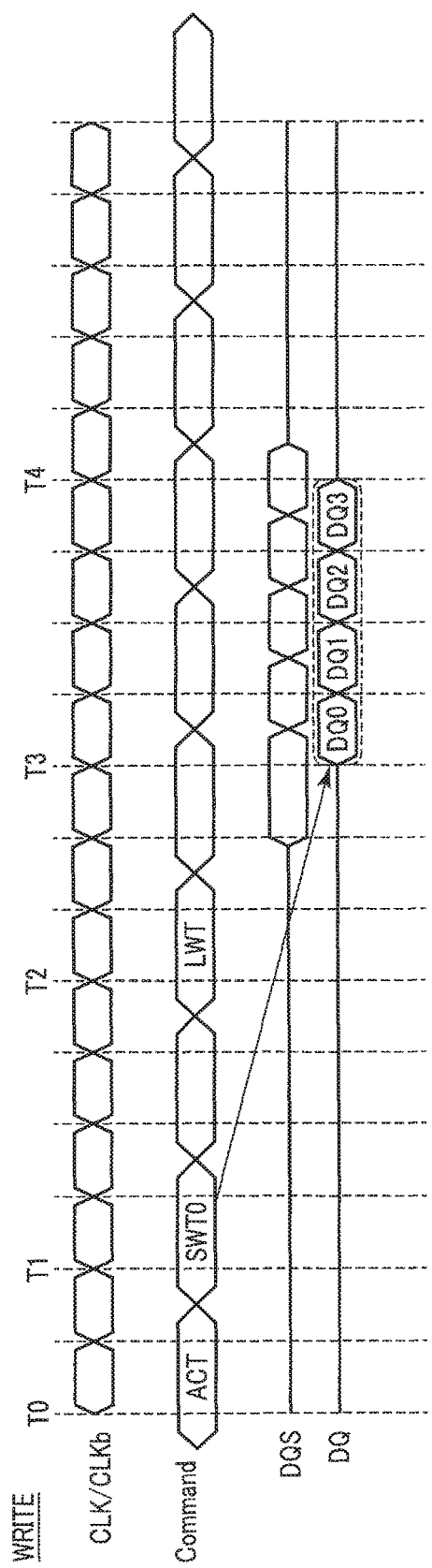
F I G. 22

US 9,761,306 B1

RESISTIVE MEMORY DEVICE AND METHOD OF PROGRAMMING THE SAME

CROSS REFERENCE TO RELATED APPLICATIONS

This application is based upon and claims the benefit of priority from U.S. Provisional Application No. 62/305,469, filed Mar. 8, 2016, the entire contents of all of which are incorporated herein by reference.

FIELD

The embodiments described herein relate generally to a semiconductor memory device.

BACKGROUND

A Magnetoresistive Random Access Memory (MRAM) is a memory device wherein a memory cell for storing information employs an element having a magnetoresistive effect. The MRAM receives attention as a next-generation memory device featured by a high-speed operation, a large storage capacity, and non-volatility.

BRIEF DESCRIPTION OF THE DRAWINGS

FIG. 3A is a sectional view illustrating a schematic structure of a variable resistive element employed in a semiconductor memory device according to an embodiment.

FIG. 3B is a sectional view illustrating a write performed by a variable resistive element of a P-state semiconductor memory device according to an embodiment.

FIG. 3C is a sectional view illustrating a write performed by an AP-state variable resistive element of a semiconductor memory device according to an embodiment.

FIG. 4 is a block diagram illustrating a memory cell array and a read/write circuit which are employed in a semiconductor memory device according to an embodiment.

FIG. 5 is a block diagram illustrating a sense amplifier latch circuit employed in a semiconductor memory device according to an embodiment.

FIG. 6 is a block diagram illustrating a page buffer circuit employed in a semiconductor memory device according to an embodiment.

FIG. 7 is a block diagram illustrating a write driver controller employed in a semiconductor memory device according to an embodiment.

FIG. 8 is a block diagram illustrating a pulse generation circuit employed in a semiconductor memory device according to an embodiment.

FIG. 11 is a flowchart illustrating a write performed by a semiconductor memory device according to an embodiment.

FIG. 12 is a flowchart illustrating the first short write sequence depicted in FIG. 11.

FIG. 13 illustrates data information in the columns in step S22 shown in FIG. 12.

FIG. 14 illustrates how data information in a column are in steps S22-S27 shown in FIG. 12.

FIG. 19 illustrates data information in the columns of step S42 shown in FIG. 18.

FIG. 20 illustrates data information in the columns of steps S43-S46 shown in FIG. 18.

FIG. 22 is a timing chart illustrating a various signals of another example of a write performed by a semiconductor memory device according to an embodiment.

DETAILED DESCRIPTION

Figure 1:
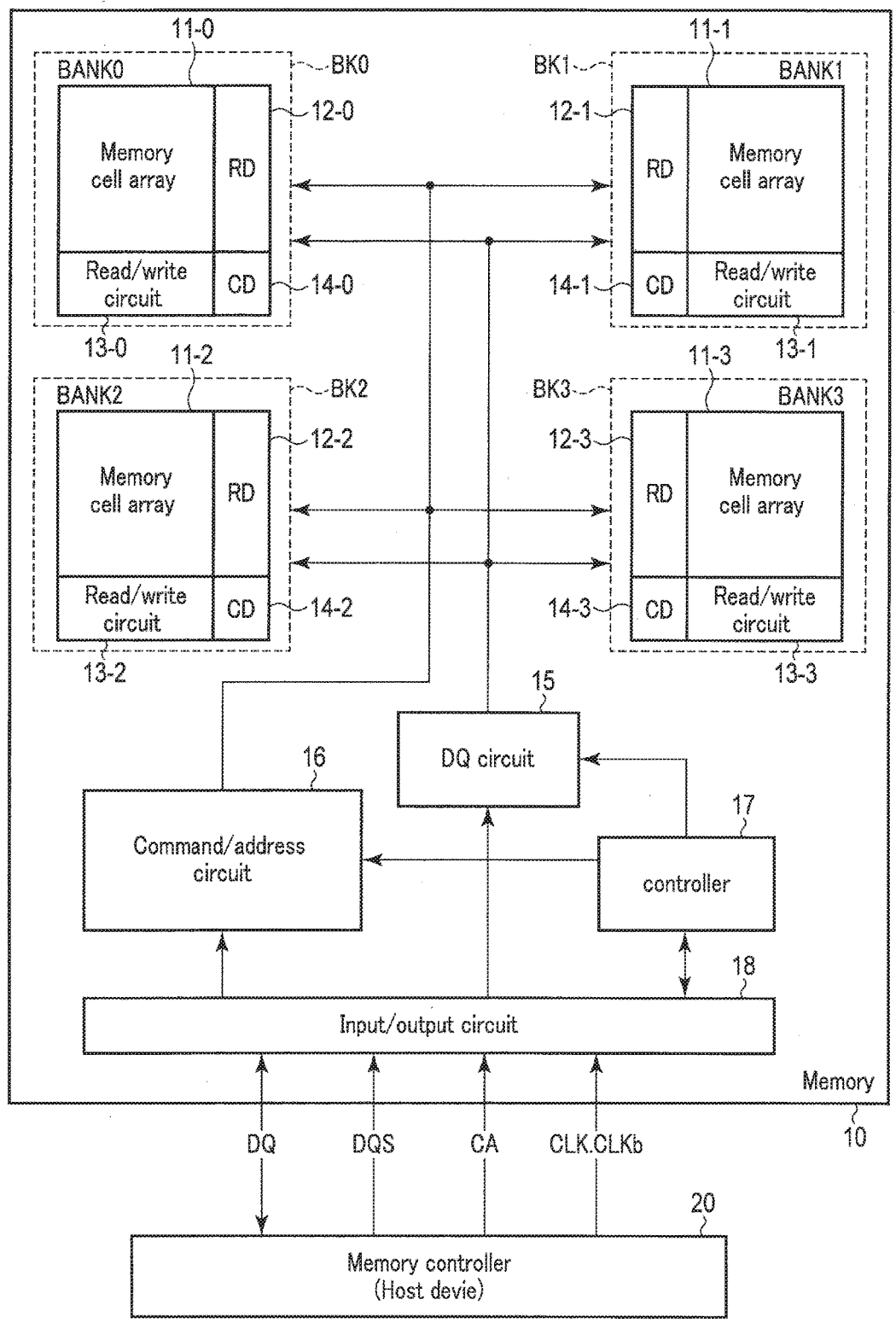
FIG. 1 is a block diagram illustrating a general architecture of a semiconductor memory device according to an embodiment.

In general, according to one embodiment, a semiconductor memory device comprises a first memory cell including a first variable resistive element, and a first circuit for controlling a write performed for the first memory cell. The first circuit performs a first write for writing first data in the first memory cell in a first time, determines whether the first write fails or not, and performs a second write for writing the first data in the first memory cell in a second time longer than the first time, if the first write fails.

Hereinafter, the embodiments will be described with reference to the accompanying drawings. In the drawings, the same reference numerals or symbols are used to indicate similar portions.

Embodiment

A semiconductor memory device according to a present embodiment will be described with reference to FIGS. 1 to 22.

In the description below, an MRAM, which stores data by use of a Magnetic Tunnel Junction (MTJ) element, will be mentioned as an example of a variable resistive element, but the variable resistive element is not limited to the MRAM. The present embodiment is applicable to those memories which convert a resistance difference of a variable resistive element into a current difference or voltage difference. In the description below, the word "connect (couple)" means not only a direct connection but also an indirect connection wherein a connection is made by way of an element. When one end of a transistor is mentioned, it is either the source or drain of that transistor, and the other end thereof is the remaining one (source or drain) of the transistor.

[Configuration Example in Embodiment]

FIG. 1 is a block diagram illustrating a general architecture of a semiconductor memory device according to an embodiment.

As shown in FIG. 1, the semiconductor memory device comprises a memory 10 and a memory controller (host device) 20.

The memory 10 is, for example, an MRAM, a Dynamic Random Access Memory (DRAM), a Resistive Random Access Memory (ReRAM), or a Phase Change Random Access Memory (PCRAM). In the description below, reference will be made to the case where the memory 10 is an MRAM.

From the memory controller 20, the memory 10 receives a command/address signal CA, data DQ, a data strobe signal DQS and clocks CLK/CLKb. The memory 10 transmits data DQ to the memory controller 20.

The memory controller 20 includes a Central Processing Unit (CPU), a RAM, a Read Only Memory (ROM) or the like. The memory controller 20 controls the memory 10 by issuing commands.

The memory 10 comprises banks BK (BK0 to BK3AS), a data circuit 15, a command/address circuit 16, a controller 17 and an input/output circuit 18.

Bank BK0 includes a memory cell array 11_0, a row decoder 12_0, a read/write circuit 13_0 and a column decoder 14_0. Banks BK1 to BK3 have a similar configuration to that of bank BK0, and include memory cell arrays 11_1 to 11_3, row decoders 12_1 to 12_3, read/write circuits 13_1 to 13_3 and column decoders 14_1 to 14_3, respectively. In the description below, the configuration of bank BK0 will be mentioned as an example. A bank BK is a maximal activation unit that can be selected by the memory controller 20.

Figure 2:
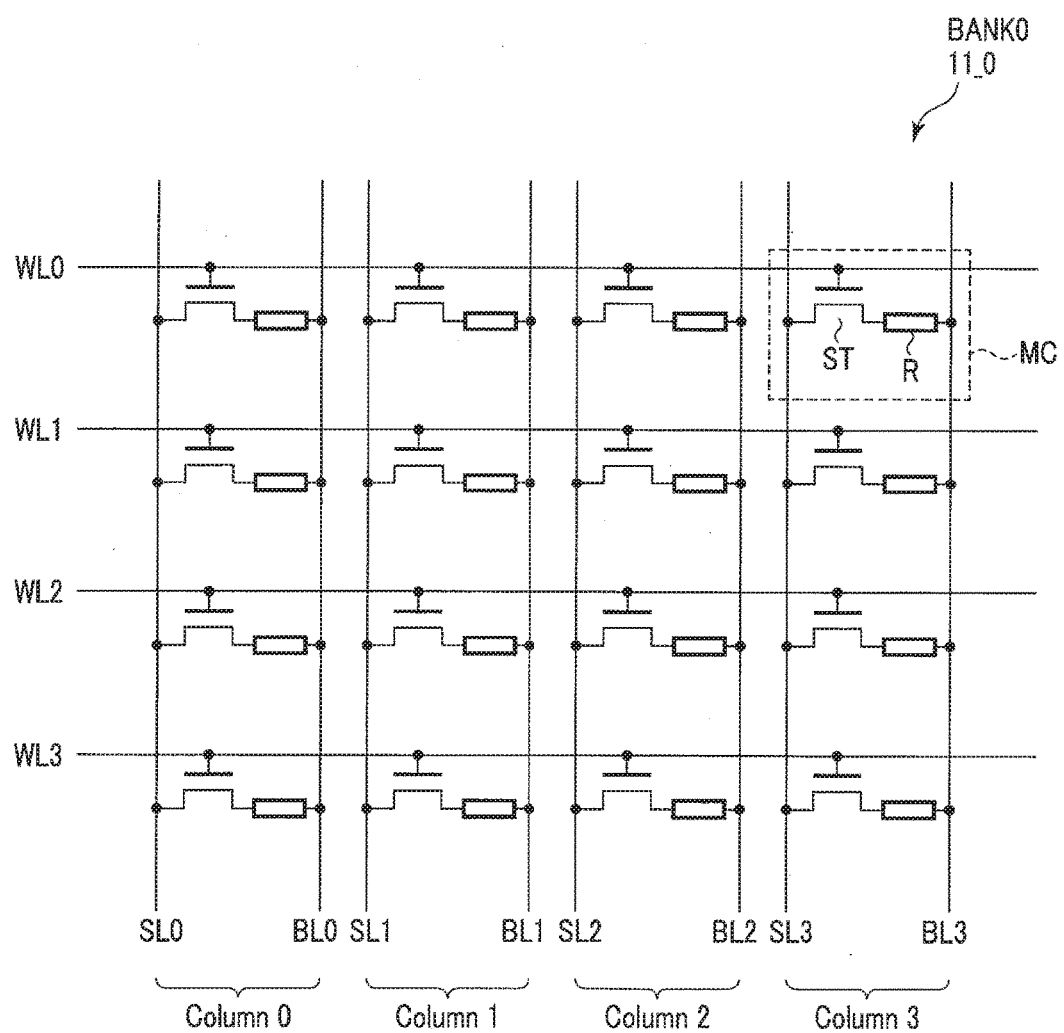
FIG. 2 illustrates a memory cell array of a semiconductor memory device according to an embodiment.

FIG. 2 illustrates a memory cell array 11_0 of a semiconductor memory device according to an embodiment.

As shown in FIG. 2, the memory cell array 11_0 is provided with bit lines BL (BL0 to BL3), source lines SL (SL0 to SL3) and word lines WL (WL0 to WL3). The bit lines BL and source lines SL extend in a first direction and alternate in a second direction perpendicular to the first direction. The word lines WL extend in the second direction. The memory cell array 10 comprises a plurality of memory cells MC. Each of the memory cells MC is arranged at an intersection where a bit line BL and a source line SL intersect with word line WL. By this arrangement, the memory cells MC are arranged in a matrix pattern in the first and second directions. Let us assume that bit line BL0 and source line SL0 form column 0, bit line BL1 and source line SL1 form column 1, bit line BL2 and source line SL2 form column 2, and bit line BL3 and source line SL3 form column 3. One word line WL and a memory cell MC coupled thereto will be referred to as a "page."

The number of columns provided in memory cell array 11_0, and the numbers of bit lines BL, source lines SL and word lines WL provided in a column are merely examples, and are not restrictive.

Each memory cell MC includes, for example, a variable resistive element R and a selection transistor ST. One end of the variable resistive element R is electrically coupled to bit line BL, and the other end thereof is electrically coupled to one end of the selection transistor ST. The other end of the selection transistor ST is electrically coupled to source line SL, and the gate of the selection transistor ST is electrically coupled to word line WL.

The variable resistive element R is an element whose resistance value varies in accordance with a current (or a voltage) supplied (applied) thereto. The variable resistive element R is, for example, an MTJ element, a phase-change element, a ferroelectric element or the like. Memory cell MC is selected when the related selection transistor ST is turned on by word line WL. In the description below, it is assumed that the MRAM (variable resistive element) is an MTJ element.

FIG. 3A is a sectional view illustrating a schematic structure of variable resistive element R, which is employed in a semiconductor memory device according to an embodiment. In FIG. 3A, the variable resistive element R is depicted as comprising a memory layer 31, a tunnel barrier layer 32 and a reference layer 33.

As shown in FIG. 3A, the variable resistive element R is a stack member comprising: a memory layer 31 formed of a ferromagnetic layer; a reference layer 33 formed of a ferromagnetic layer; and a tunnel barrier layer 32 formed of a nonmagnetic layer and located between the memory layer 31 and the reference layer 33.

The memory layer 31 is a ferromagnetic layer whose magnetization direction is variable, and has perpendicular magnetic anisotropy which is perpendicular or substantially perpendicular to the film surfaces (upper/lower surface). The "variable" magnetization direction is intended to refer to the state where the magnetization direction varies in response to a predetermined write current. The "substantially perpendicular" is intended to refer to the state where the direction of remnant magnetization is within $45°<\theta\leq90°$ with respect to the film surfaces. The memory layer 31 is formed, for example, of cobalt iron boride (CoFeB) or iron boride (FeB).

The tunnel barrier layer 32 is located on the memory layer 31. The tunnel barrier layer 32 is a nonmagnetic layer and is formed, for example, of MgO.

The reference layer 33 is located on the tunnel barrier layer 32. The reference layer 33 is a ferromagnetic layer whose magnetization direction is fixed, and has perpendicular magnetic anisotropy which is perpendicular or substantially perpendicular to the film surfaces (upper/lower surface). The fixed magnetization direction is intended to refer to the state where the magnetization direction does not vary in response to a predetermined write current. The reference layer 33 has a larger inversion energy barrier in the magnetization direction than the memory layer 31. The reference layer 33 is formed, for example, of cobalt platinum (CoPt), cobalt nickel (CoNi) or cobalt palladium (CoPd).

FIG. 3B illustrates a write performed by the variable resistive element R of a semiconductor memory device according to an embodiment and is a sectional view showing that the variable resistive element is in a parallel state (P state). FIG. 3C illustrates a write performed by the variable resistive element R of a semiconductor memory device according to an embodiment, and is a sectional view showing that the variable resistive element is in an anti-parallel state (AP state).

The variable resistive element is, for example, a spin-injection variable resistive element. Therefore, when data is written in the variable resistive element R or is read therefrom, a current flows in opposite directions that are perpendicular to the film surfaces.

To be more specific, data is written in the variable resistive element R as follows:

As shown in FIG. 3B, where a current flows from the memory layer 31 to the reference layer 33, namely, where electrons are supplied from the reference layer 33 to the memory layer 31, electrons that are spin-polarized in the same direction as the magnetization direction of the reference layer 33 are injected into the memory layer 31. In this case, the magnetization direction of the memory layer 31 and the magnetization direction of the reference layer 33 are the same. Accordingly, the magnetization direction of the memory layer 31 and the magnetization direction of the reference layer 33 are parallel. In this parallel state, the resistance value of the variable resistive element R is smallest. Data in this state is defined as "0" data.

As shown in FIG. 3C, where a current flows from the reference layer 33 to the memory layer 31, namely, where electrons are supplied from the memory layer 31 to the reference layer 33, electrons that are reflected by the reference layer 33 and are therefore spin-polarized in the direction opposite to that of the magnetization direction of the reference layer 33 are injected into the memory layer 31. In this case, the magnetization direction of the memory layer 31 and the magnetization direction of the reference layer 33 are opposite to each other. Accordingly, the magnetization direction of the memory layer 31 and the magnetization direction of the reference layer 33 are anti-parallel. In this anti-parallel state, the resistance value of the variable resistive element R is largest. Data in this state is defined as "1" data.

Data is from the variable resistive element R as follows:

A read current is supplied to the variable resistive element R. The read current is set as a value that does not invert the magnetization direction of the memory layer 31 (i.e., a value smaller than the value of the write current). The "0" data and "1" data described above can be read out by detecting how the resistance value of the variable resistive element R varies.

Turning back to FIG. 1, row decoder 12_0 selects word line WL in accordance with a row address. Column decoder 14_0 selects bit line BL and source line SL in accordance with a column address. Read/write circuit 13_0 controls a write of writing data in memory cell array 11_0 and a read operation of reading data from memory cell array 11_0. Details of the read/write circuit 13_0 will be described later.

The input/output circuit 18 controls the signal transmission between the memory 10 and the memory controller 20. To be more specific, from the memory controller 20, the input/output circuit 18 receives a command/address signal CA, data DQ, a data strobe signal DQS and clocks CLK/CLKb. The input/output circuit 18 supplies the command/address signal CA and clocks CLK/CLKb, received from the memory controller 20, to the command/address circuit 16. The input/output circuit 18 also transfers the data DQ, received from the memory controller 20, to the data circuit 15. Furthermore, the input/output circuit 18 supplies various control signals to the controller 17.

The command/address circuit 16 receives the command/address signal CA from the input/output circuit 18 and supplies a signal based thereon to banks BK0 to BK3. The command/address circuit 16 receives clocks CLK and CLKb from the input/output circuit 18 and outputs various signals at timings based on clocks CLK and CLKb.

The data circuit DQ receives data DQ from the input/output circuit 18 and forwards it to banks BK0 to BK3.

The controller 17 includes elements, such as a voltage generator, and controls the structural elements based on a control signal supplied from the input/output circuit 18.

FIG. 4 is a block diagram illustrating memory cell array 11_0 and read/write circuit 13_0, which are employed in the semiconductor memory device of an embodiment.

As shown in FIG. 4, the read/write circuit 13_0 comprises first to fourth read/write circuits 13_00 to 13_03. The first to fourth read/write circuits 13_00 to 13_03 are coupled to column 0 to column 3, respectively, and control the write and read operation performed for column 0 to column 3. The first to fourth read/write circuits 13_00 to 13_03 are similar in configuration. In what follows, therefore, the configuration of the first read/write circuit 13_00 will be described by way of example.

The first read/write circuit 13_00 comprises a sense amplifier latch circuit 41, a sense amplifier 42, a page buffer circuit 43, a write driver controller 44, a write driver 45 and a pulse generation circuit 46.

The sense amplifier 42 senses a read current or a read voltage applied to memory cell MC and supplies the sensing result (read data) to the sense amplifier latch circuit 41. The sense amplifier latch circuit 41 receives the read data from the sense amplifier 42 and stores it temporarily. Also, the sense amplifier latch circuit 41 temporarily stores the write data supplied from the page buffer circuit 43.

The page buffer circuit 43 temporarily stores write data to be supplied to memory cell MC and read data read from memory cell MC (sense amplifier latch circuit 41).

The pulse generation circuit 46 generates a short write pulse having a small pulse width and a long write pulse having a large pulse width.

The write driver controller 44 compares the data in the sense amplifier latch circuit 41 with the data in the page buffer circuit 43. In accordance with the short write pulse and long write pulse supplied from the pulse generation circuit 46, the write driver controller 44 perform a short write (the write time of which is short) and a long write (the write time of which is long).

Under the control of the write driver controller 44, the write driver 45 applies a write voltage to bit line BL and source line SL, thereby causing a write current to flow to memory cell MC.

Each of the structural elements will be described in detail.

FIG. 5 is a block diagram illustrating a sense amplifier latch circuit 41 employed in the semiconductor memory device according to an embodiment.

As shown in FIG. 5, the sense amplifier latch circuit 41 comprises transfer gate TF1 and TF2, latch SAL (hereinafter referred to as a sense amplifier latch) and inverters IV3 and IV4.

Transfer gate TF1 receives a signal (read data) supplied thereto from memory cell array 11_0 by way of the sense amplifier 42. An output of transfer gate TF1 is supplied to the sense amplifier latch SAL (inverter IV1). Transfer gate TF1 includes a PMOS transistor and an NMOS transistor, and one end of each of these transistors functions as an input portion and the other end of each of them functions as an output portion. Signal RLEN supplied from the command/address circuit 16 is supplied to the gate of the NMOS transistor, and signal RLENb supplied from inverter IV4 is supplied to the gate of the PMOS transistor.

Transfer gate TF2 receives signal Write Data (i.e., a signal based on write data) supplied from the page buffer circuit (inverter IV8) is supplied to transfer gate TF2. An output of transfer gate TF2 is supplied to the sense amplifier latch SAL (inverter IV1). Transfer gate TF2 includes a PMOS transistor and an NMOS transistor, and one end of each of these transistors functions as an input portion and the other end of each of them functions as an output portion. Signal WSTR supplied from the command/address circuit 16 is supplied to the gate of the NMOS transistor, and signal WSTRb supplied from inverter IV3 is supplied to the gate of the PMOS transistor.

The sense amplifier latch SAL includes inverters IV1 and IV2. The input of inverter IV1 is electrically coupled to the output of inverter IV2, and the input of inverter IV2 is electrically coupled to the output of inverter IV2. Outputs from transfer gates TF1 and TF2 are supplied to inverter IV1 of the sense amplifier latch SAL. In other words, the sense amplifier latch SAL receives a signal based on the read data supplied from the memory cell MC by way of transfer gate TF1 and a signal based on the write data supplied from the page buffer PB by way of transfer gate TF2. An output of inverter IV1 (i.e., an output of the sense amplifier SDAL) is signal Read Data (a signal based on the read data).

FIG. 6 is a block diagram illustrating the page buffer circuit 43, employed in a semiconductor memory device according to an embodiment.

As shown in FIG. 6, the page buffer circuit 43 comprises a multiplexer MP1, transfer gates TF3 and TF4, a latch PB (hereinafter referred to as a page buffer), and inverters IV7-IV10.

The multiplexer MP1 receives signal Read Data supplied from the sense amplifier latch circuit 41 (inverter IV1) and signal DQin (write data) supplied from the data circuit 15. The multiplexer MP1 also receives signal READ/WRITE from the command/address circuit 16. The multiplexer MP1 selects signal Read Data in response to the reception of signal READ, and selects signal DQin in response to the reception of signal WRITE. An output of the multiplexer MP1 is supplied to transfer gate TF3.

An output of transfer gate TF3 is supplied to the page buffer PB. Transfer gate TF3 includes a PMOS transistor and an NMOS transistor, and one end of each of these transistors functions as an input portion and the other end of each of them functions as an output portion. Signal PBIN supplied from the command/address circuit 16 is supplied to the gate of the NMOS transistor, and signal PBINb supplied from inverter IV9 is supplied to the gate of the PMOS transistor.

The page buffer PB includes inverters IV5 and IV6. The input of inverter IV5 is electrically coupled to the output of inverter IV6, and the input of inverter IV6 is electrically coupled to the output of inverter IV5. An output of transfer gate TF3 is supplied to inverter IV5 of the page buffer PB. In other words, the page buffer PB receives a signal based on the read data and a signal based on the write data supplied by way of transfer gate TF3. An output of inverter IV5 (i.e., an output of the page buffer PB) is supplied to transfer gate TF4 and inverter IV7.

An output of inverter IV7 is supplied to inverter IV8. An output of inverter IV8 is signal Write Data.

An output of transfer gate TF4 is signal DQout. Transfer gate TF4 includes a PMOS transistor and an NMOS transistor, and one end of each of these transistors functions as an input portion and the other end of each of them functions as an output portion. Signal PBOUT supplied from the command/address circuit 16 is supplied to the gate of the NMOS transistor, and signal PBOUTb supplied from inverter IV10 is supplied to the gate of the PMOS transistor.

FIG. 7 is a block diagram illustrating the write driver controller 44, employed in a semiconductor memory device according to an embodiment.

As shown in FIG. 7, the write driver controller 44 comprises an exclusive-OR gate EXOR1, NAND gates ND1 and ND2, and inverters IV11-IV13.

The exclusive-OR gate EXOR1 receives signal Read Data supplied from the sense amplifier latch circuit 41 (inverter IV1) and signal Write Data supplied from the page buffer 43 (inverter IV8). An output of the exclusive-OR gate EXOR1 is signal DIFF. The exclusive-OR gate EXOR1 raises signal DIFF to the H level when signal Read Data and signal Write Data are different, and lowers signal DIFF to the L level when these signals are the same.

NAND gate ND1 receives signal DIFF, signal WRITE_PULSE supplied from the pulse generation circuit 46 (SR latch circuit 46H), and signal Write Data supplied from the page buffer 43 (inverter IV8). An output of NAND gate ND1 is supplied to inverter IV11. An output of inverter IV11 is supplied to the write driver 45 on the side of bit line BL.

NAND gate ND2 receives signal DIFF, signal WRITE_PULSE supplied from the pulse generation circuit 46 (SR latch circuit 46H), and signal Write Data_b supplied from inverter IV13. An output of NAND gate ND2 is supplied to inverter IV12. An output of inverter IV12 is supplied to the write driver 45 on the side of source line SL.

FIG. 8 is a block diagram illustrating the pulse generation circuit 46, employed in a semiconductor memory device according to an embodiment.

As shown in FIG. 8, the pulse generation circuit 46 comprises a resetting circuit 46A, a latch circuit 46B, shift registers 46C and 46D, delay circuits 46E, 46F and 46G, an SR latch circuit 46H, a driver 46I, AND gates AD1 and AD2, and multiplexers MP2 and MP3.

The resetting circuit 46A receives signals WEN1 and RESET from the command/address circuit 15. An output of the resetting circuit 46A is signal WARST.

The latch circuit 46B receives signal WARST and also receives signal COL supplied from the command/address circuit 15. The latch circuit 46B further receives signal WENS (clock CLK). An output A0 of the latch circuit 46B is supplied to shift register 46C. Signal WEN_EN<0> (clock CLK) is also supplied to shift register 46C. An output A1 of shift register 46C passes through a plurality of shift registers and then enters shift register 46D as input An−1. Signal WEN_EN<n−1> (clock CLK) is also supplied to shift register 46D. Shift register 46D provides output An.

Signal WENS is supplied to delay circuit 46E. An output of delay circuit 46E is signal WENSd.

Signal WENSd and output A0 are supplied to AND gate AD1. An output of AND gate AD1 is signal WAYTS.

Signal WEN_EN<0> is supplied to delay circuit 46F. An output of delay circuit 46F is supplied to multiplexer MP2. On the other hand, signal WEN_EN<n−1> is supplied to delay circuit 46G. An output of delay circuit 46G is supplied to multiplexer MP2. Delay circuit 46F and delay circuit 46G may be integrated as one delay circuit.

Outputs of delay circuits 46F and 46G are supplied to multiplexer MP2. Signal LONG_WRITE is also supplied to multiplexer MP2. Multiplexer MP2 selects a delayed signal of signal WEN_EN<n−1> when signal LONG_WRITE is at the H level, and selects a delayed signal of signal WEN_EN<0> when signal LONG_WRITE is at the L level. An output of multiplexer MP2 is signal WENEd.

Outputs A1 and An are supplied to multiplexer MP3. Signal LONG_WRITE is also supplied to multiplexer MP3. Multiplexer MP3 selects output An when signal LONG_WRITE is at the H level, and selects output A1 when signal LONG_WRITE is at the L level. Multiplexer MP3 provides output Ad.

Signal WENEd and output Ad are supplied to AND gate AD2. An output of AND gate AD2 is signal WAYTE.

Signals WAYTS and WAYTE are supplied to the SR latch circuit 46H. An output of the SR latch circuit 46H is signal WRITE_PULSE.

Signal WAYTE is supplied to the driver 46I. An output of the driver 46I is signal WSTR.

Figure 9:
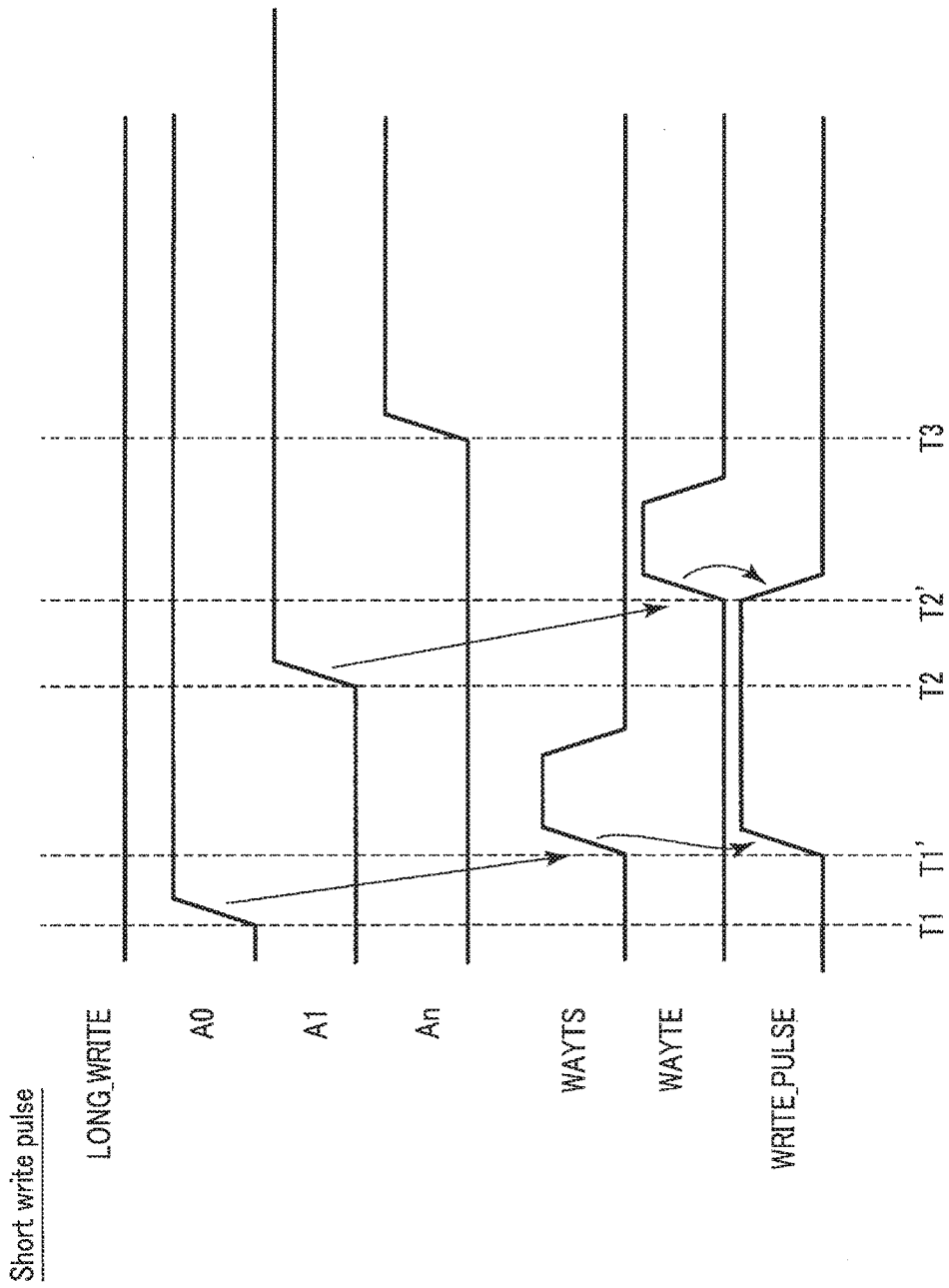
FIG. 9 is a timing chart illustrating various signals of a pulse generation circuit when a short write pulse is generated in a semiconductor memory device according to an embodiment.
Figure 10:
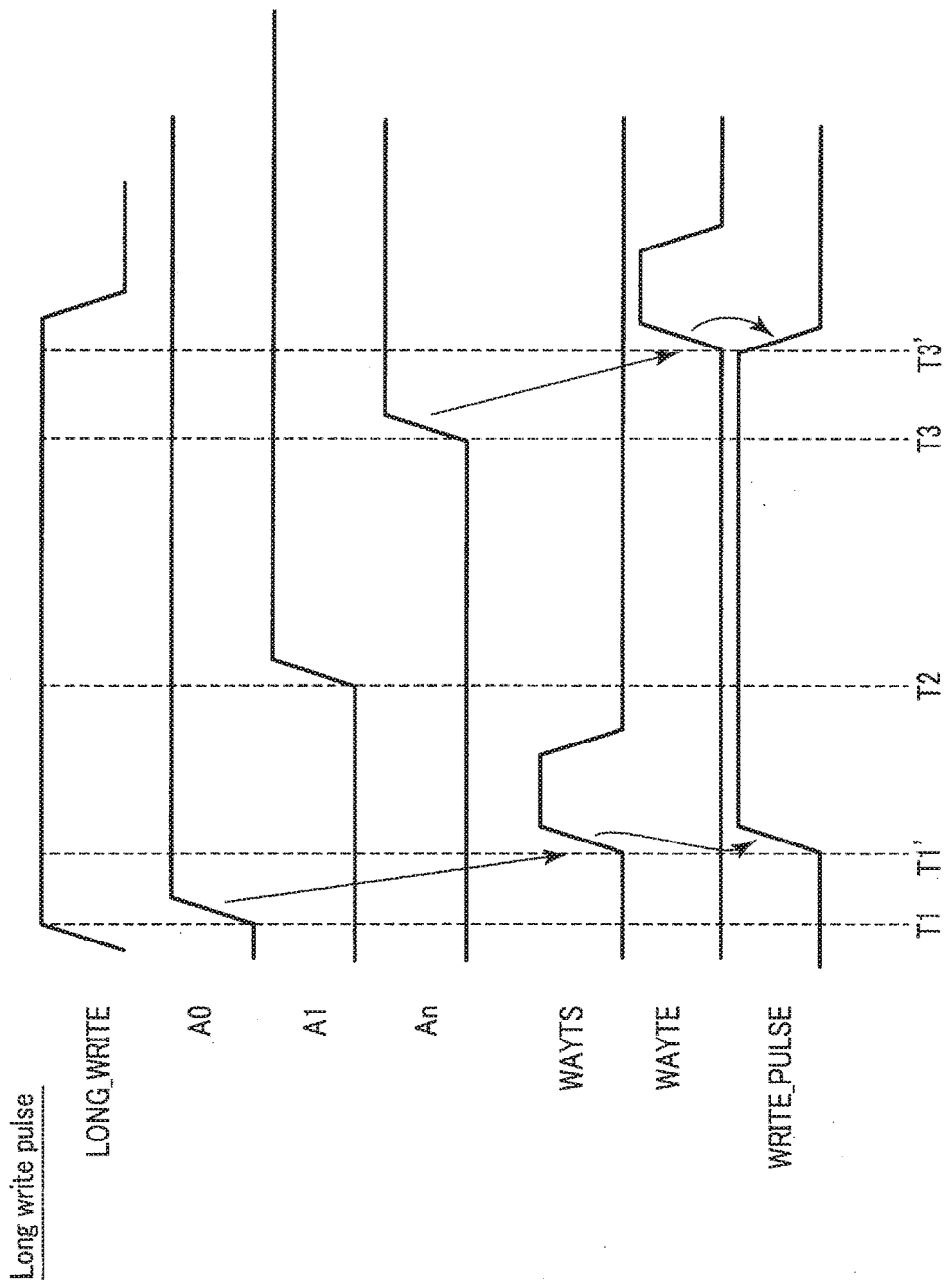
FIG. 10 is a timing chart illustrating various signals of a pulse generation circuit when a long write pulse is generated in a semiconductor memory device according to an embodiment.

FIG. 9 is a timing chart illustrating various signals of the pulse generation circuit 46 when a short write pulse is generated in a semiconductor memory device according to an embodiment. FIG. 10 is a timing chart illustrating various signals of the pulse generation circuit 46 when a long write pulse is generated in a semiconductor memory device according to an embodiment.

The short write pulse refers to signal WRITE_PULSE that maintains the H (High) level for a short time, while the long write pulse refers to signal WRITE_PULSE that maintains the H (High) level for a long time. The pulse width indicates the width (time) of signal WRITE_PULSE that is at the H level.

As shown in FIG. 9, when a short write pulse is generated, signal LONG_WRITE is at the L (low) level in the pulse generation circuit 46. Signal LONG_WRITE of the L level is supplied to multiplexer MP3.

At time T1, output A0 rises to the H level. Although illustration is omitted, signal WENSd rises to the H level based on signal WENS.

In response to this, output signal WAYTS of AND gate AD1 rises to the H level at time T1'. Based on the rise time of signal WAYTS, output signal WRITE_PULSE of the SR latch circuit 46H rises to the H level. Thereafter, signal WAYTS falls to the L level.

Next, at time T2, output A1 rises to the H level. Since signal LONG_WRITE of the L level is supplied to multiplexer MP3 then, multiplexer MP3 selects output A1 and raises output Ad to the H level based on the selection. Although illustration is omitted, signal LONG_WRITE of the L level is also supplied to multiplexer MP2, so that signal WENEd rises to the H level based on signal WEN_EN<0>.

In response to this, output signal WAYTE of AND gate AD2 rises to the H level at time T2'. Based on the rise time of signal WAYTE, output signal WRITE_PULSE of the SR latch circuit 46H falls to the L level.

Subsequently, at time T3, output An rises to the H level. Since signal LONG_WRITE of the L level is supplied to multiplexer MP3 then, multiplexer MP3 does not select output An.

As can be seen from this, when the short write pulse is generated, signal WRITE_PULSE rises to the H level (the generation of the short write pulse) in accordance with signal WAYTS based on output A0 and signal WAYTE based on output A1. That is, the pulse width (time) of the short write pulse is from time T1' to time T2'.

As shown in FIG. 10 when a long write pulse is generated, signal LONG_WRITE is at the H level in the pulse generation circuit 46. Signal LONG_WRITE of the H level is supplied to multiplexer MP3.

As in the case where the short write pulse is generated, output signal WAYTS of AND gate AD1 rises to the H level at time T1'. Based on the rise time of signal WAYTS, output signal WRITE_PULSE of the SR latch circuit 46H rises to the H level. Thereafter, signal WAYTS falls to the L level.

Next, at time T2, output A1 rises to the H level. Since signal LONG_WRITE of the H level is supplied to multiplexer MP3 then, multiplexer MP3 does not select output A1.

Next, at time T3, output An rises to the H level. Since signal LONG_WRITE of the H level is supplied to multiplexer MP3 then, multiplexer MP3 selects output An and raises output Ad to the H level based on the selection. Although illustration is omitted, signal LONG_WRITE of the H level is also supplied to multiplexer MP2, signal WENEd rises to the H level based on signal WEN_EN<n−1>.

In response to this, output signal WAYTE of AND gate AD2 rises to the H level at time T3'. Based on the rise time of signal WAYTE, output signal WRITE_PULSE of the SR latch circuit 46H falls to the L level.

As can be seen from this, when the long write pulse is generated, signal WRITE_PULSE rises to the H level (the generation of the long write pulse) in accordance with signal WAYTS based on output A0 and signal WAYTE based on output An. Signal WAYTE based on output An is a signal delayed relative to signal WAYTE based on output A1 of the case where a short pulse is generated. That is, the pulse width (time) of the long write pulse is from time T1' to time T3'.

[Write Operation in Embodiment]

FIG. 11 is a flowchart illustrating a write performed by a semiconductor memory device according to an embodiment. FIG. 11 illustrates writing data in bank BK including columns 0-3.

As shown in FIG. 11, in step S11, an active command ACT is received by the command/address circuit 16. The active command ACT includes a bank address and a row address. Based on the active command ACT, write target bank BK and a word line WL are selected.

The read/write circuit 13 executes a first short write sequence for column 0 in step S12. Subsequently, the read/write circuit 13 executes a second short write sequence for column 1 in step S13, executes a third short write sequence for column 2 in step S14, and executes a fourth short write sequence for column 3 in step S15.

Next, in step S16, the read/write circuit 13 executes a long write sequence for all columns.

FIG. 12 is a flowchart illustrating the first short write sequence (ST12) depicted in FIG. 11. FIG. 13 illustrates data information in columns 0-3 in step S22 shown in FIG. 12, and FIG. 14 illustrates data information in column 0 in steps S23-S27 shown in FIG. 12. In FIGS. 13 and 14, the white circles indicate "0" data, and the black circles indicate "1" data.

As shown in FIG. 12, in step S21, a short write command SWT0 is received by the command/address circuit 16. The short write command SWT0 includes a column address CA0 (i.e., the address of column 0). Therefore, column 0 is selected.

Next, in step S22, the data in memory cell MC (cell data) is transferred to the sense amplifier latch SAL and page buffer PB (load) in all columns 0-3. For example, cell data "1" is transferred to the sense amplifier latch SAL and page buffer PB in column 0, as shown in FIG. 13. Similarly, in columns 1-3, cell data "1" and cell data "0" are transferred to the sense amplifier latch SAL and page buffer PB. As a result, the data in memory cell MC, the data in the sense amplifier latch SAL and the data in the page buffer PB become identical in all columns (columns 0-3).

Next, in step S23, the data circuit 15 transfers externally-supplied data DQ to the page buffer PB of column 0. For example, as shown in FIG. 14, externally-supplied data DQ "0" is transferred to the page buffer PB in column 0.

Next, in column 0, the write driver controller 44 (exclusive-OR gate EXOR1) compares the data in the sense amplifier latch SAL with the data in the page buffer PB (step S24). It should be noted that the data in the sense amplifier latch SAL is data previously written in the memory cell, and the data in the page buffer PB is data which is to be newly written in the memory cell MC.

If it is determined in step S25 that the data in the sense amplifier latch SAL and the data in the page buffer PB are not identical in column 0, then step S26 is executed, in which the write driver controller 44 writes the data of the page buffer PB in the memory cell MC in column 0 by using the short write pulse (short write). The short write pulse is generated by the pulse generation circuit 46. For example, in FIG. 14, data "1" in the sense amplifier latch SAL and data "0" in the page buffer PB are different, so that data "0" of the page buffer PB is written in the memory cell MC. FIG. 14 shows the case where data "0" of the page buffer PB is correctly written in the memory cell MC.

Next, in step S27, the data in the page buffer PB is transferred to the sense amplifier latch SAL (update) in column 0. For example, in FIG. 14, data "0" of the page buffer PB is transferred to the sense amplifier latch SAL.

If it is determined in step S25 that the data in the sense amplifier latch SAL and the data in the page buffer PB are identical in column 0, the cell data does not have to be rewritten. Therefore, the short write sequence is brought to an end.

Figure 15:
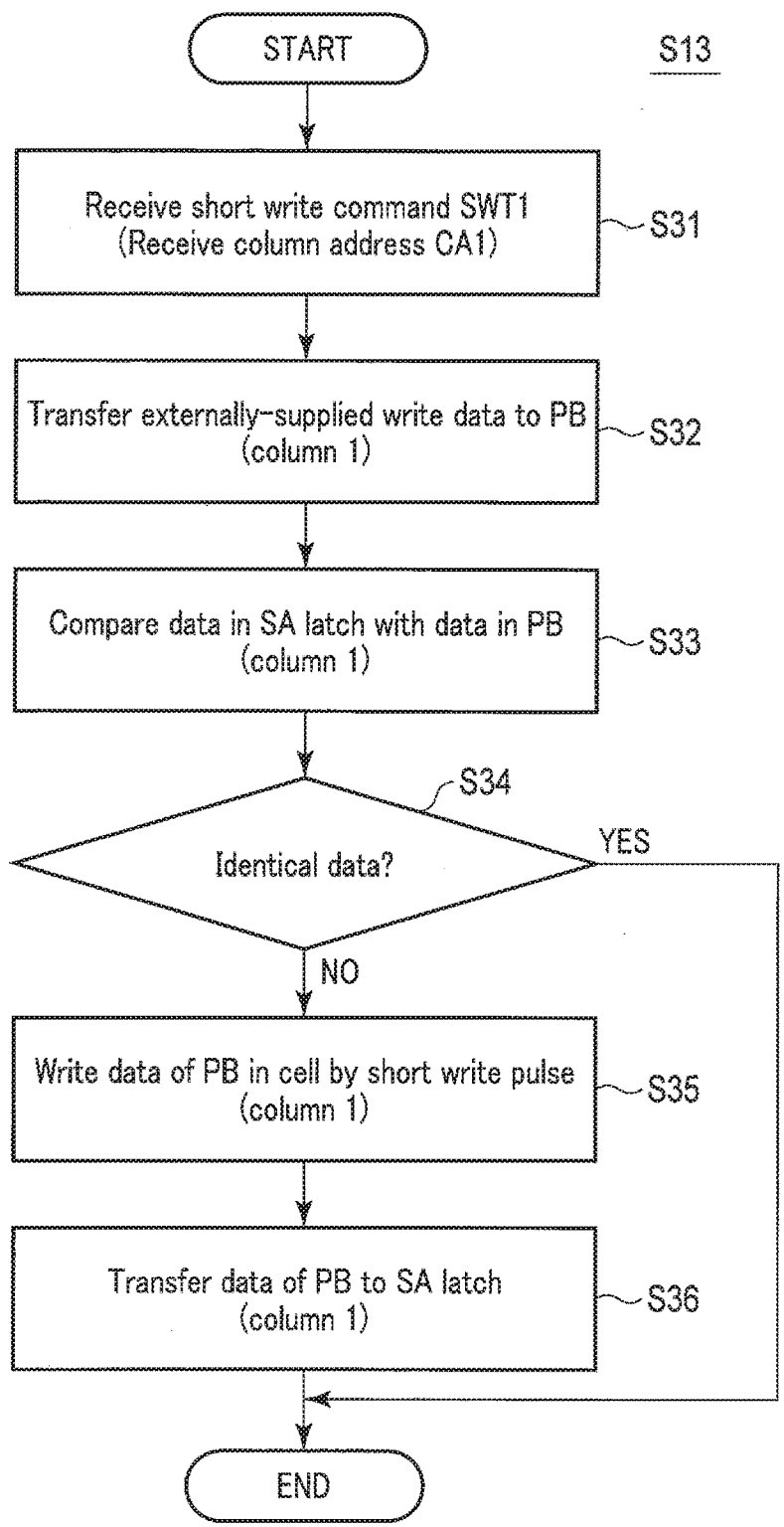
FIG. 15 is a flowchart illustrating the second short write sequence depicted in FIG. 11.
Figure 16:
FIG. 16 illustrates data information in a column in steps S32-S36 shown in FIG. 15.

FIG. 15 is a flowchart illustrating the second short write sequence (S13) depicted in FIG. 11. FIG. 16 illustrates data information in a column in steps S32-S36 shown in FIG. 15. The second short write sequence is a short write sequence performed for column 1, and is similar to the first short write sequence except that the load operation shown in step S22 is not executed. A specific description will be given below.

As shown in FIG. 15, in step S31, a short write command SWT1 is received by the command/address circuit 16. The short write command SWT1 includes a column address CA1 (i.e., the address of column 1). Therefore, column 1 is selected.

Next, in step S32, the data circuit 15 transfers externally-supplied data DQ to the page buffer PB of column 1. For example, as shown in FIG. 16, externally-supplied data DQ "1" is transferred to the page buffer PB in column 1.

Next, in column 1, the write driver controller 44 (exclusive-OR gate EXOR1) compares the data in the sense amplifier latch SAL with the data in the page buffer PB (step S33).

If it is determined in step S34 that the data in the sense amplifier latch SAL and the data in the page buffer PB are not identical in column 1, then step S35 is executed, in which the write driver controller 44 writes the data of the page buffer PB in the memory cell MC in column 1 by using the short write pulse (short write). For example, in FIG. 16, data "0" in the sense amplifier latch SAL and data "1" in the page buffer PB are different, so that data "1" of the page buffer PB is written in the memory cell MC. FIG. 16 shows the case where data "1" of the page buffer PB is not correctly written in the memory cell MC in column 1 (an example of a fail).

Next, in step S35, the data in the page buffer PB is transferred to the sense amplifier latch SAL (update) in column 1. For example, in FIG. 16, data "1" of the page buffer PB is transferred to the sense amplifier latch SAL.

If it is determined in step S34 that the data in the sense amplifier latch SAL and the data in the page buffer PB are identical in column 1, the cell data does not have to be rewritten. Therefore, the short write sequence is brought to an end.

The third short write sequence (S14) and the fourth short write sequence (S15) are similar to the second short write sequence, and reference to these sequences will be omitted. The third short write sequence (S14) is a short write sequence performed for column 2, and the fourth short write sequence (S15) is a short write sequence performed for column 3.

Figure 17:
FIG. 17 illustrates data information in a column in steps S32-S36 shown in FIG. 15.

FIG. 17 illustrates data information in column 3 in steps S22-S36 shown in FIG. 15, when the fourth short write sequence is executed. FIG. 17 illustrates the case where the data in the sense amplifier latch SAL and the data in the page buffer PB are identical in column 3. In this case, the cell data does not have to be rewritten, as mentioned above, and the short write sequence is brought to an end.

Figure 18:
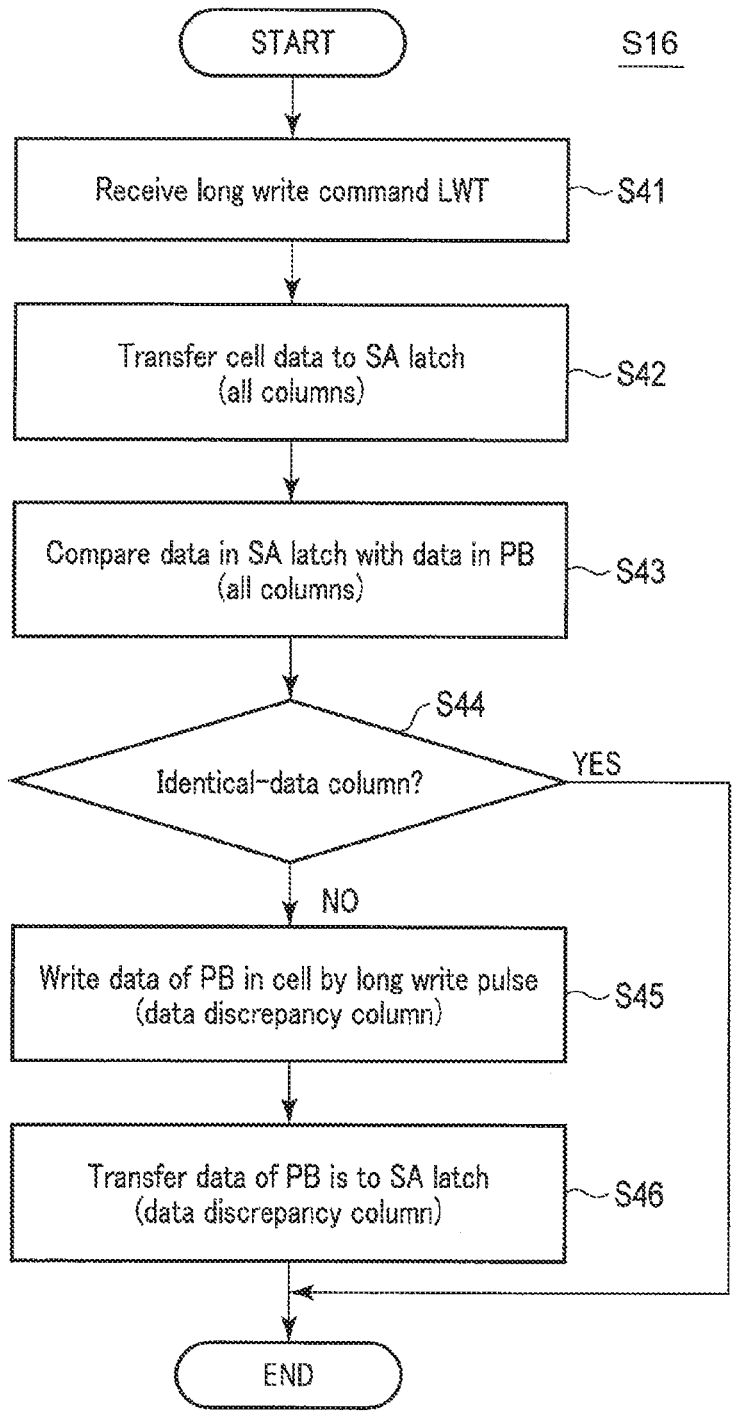
FIG. 18 is a flowchart illustrating the long write sequence depicted in FIG. 11.

FIG. 18 is a flowchart illustrating the long write sequence (S16) depicted in FIG. 11. FIG. 19 illustrates data information in columns 0-3 in step S42 shown in FIG. 18. FIG. 20 illustrates data information in columns 0-3 in steps S43-S46 shown in FIG. 18.

As shown in FIG. 18, in step S41, a long write command LWT is received by the command/address circuit 16. The long write command LWT is different from a short write command and includes a bank address and a row address.

Next, in step S42, the cell data is transferred to the sense amplifier latch SAL (load) in all columns 0-3. For example, as shown in FIG. 19, cell data "0" is transferred to the sense amplifier latch SAL in column 0. Similarly, in columns 1-3, cell data "0", cell data "1" and cell data "0" are transferred to the sense amplifier latch SAL. As a result, the data in memory cell MC and the data in the sense amplifier latch SAL become identical in all columns (columns 0-3).

Next, in all columns (columns 0-3), the write driver controller 44 (exclusive-OR gate EXOR1) compares the data in the sense amplifier latch SAL with the data in the page buffer PB (step S43). It should be noted that the data in the sense amplifier latch SAL is data actually written in the memory cell MC, and the data in the page buffer PB is data which is to be written in the memory cell MC. The data in the page buffer PB is data externally transferred in the short write sequence, and is not data updated in the long write sequence. If the data in the sense amplifier latch SAL and the data in the page buffer PB are not identical in a column, the memory cell MC of that column undergoes a fail in the short write.

If it is determined in step S44 that the data in the sense amplifier latch SAL and the data in the page buffer PB are not identical in a column (which is a failing column), then step S45 is executed, in which the write driver controller 44 writes the data of the page buffer PB in the memory cell MC once again in the data discrepancy column by using the long write pulse (long write). The long write pulse is generated by the pulse generation circuit 46. For example, in FIG. 20, column 1 is a data discrepancy column, in which data "0" in the sense amplifier latch SAL and the data "1" in the page buffer PB are different. In column 1, therefore, data "1" of the page buffer PB is written in the memory cell MC in step S45.

Next, in step S46, the data in the page buffer PB is transferred to the sense amplifier latch SAL (update) in the data discrepancy column (column 1). For example, in FIG. 20, data "0" of the page buffer PB is transferred to the sense amplifier latch SAL in column 1.

If it is determined in step S44 that the data in the sense amplifier latch SAL and the data in the page buffer PB are identical in a column, the cell data of that column does not have to be rewritten. Therefore, the long write sequence is brought to an end.

As described above, in the long write sequence of the embodiment, the page buffer PB is not updated using externally-supplied data. The method will be described with reference to FIGS. 21 and 22.

Figure 21:
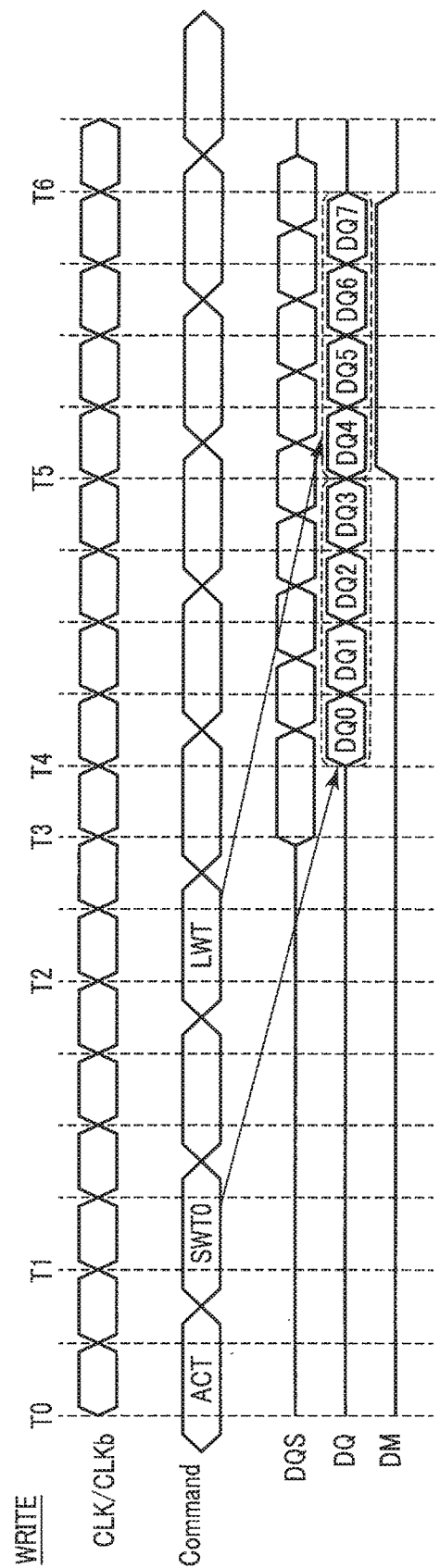
FIG. 21 is a timing chart illustrating a various signals of a first example of a write performed by a semiconductor memory device according to an embodiment.

FIG. 21 is a timing chart illustrating a various signals of a first example of a write performed by a semiconductor memory device according to an embodiment. FIG. 21 illustrates a write performed for a column (e.g., column 0) of bank BK.

As shown in FIG. 21, the memory 10 operates in accordance with commands it receives at timings determined by clocks CLK/CALKb.

In the first example, the command/address circuit 16 receives an active command ACT at time T0. The active command ACT includes a bank address and a row address. At time T1, the command/address circuit 16 receives a short write command SWT0. The short write command SWT0 includes a column address.

Subsequently, at time T2, the command/address circuit 16 receives a long write command LWT. The long write command LWT is different from the short write command and includes a bank address and a row address.

Next, from time T4 to time T5, the data circuit 15 receives data DQ0 to DQ3 in synchronism with data strobe signal DQS. Data DQ0 to DQ3 are data corresponding to the short write commands SWT0. Data DQ0 to DQ3 are data to be written in the memory cell MC and are transferred to the page buffer PB (the page buffer PB is updated thereby).

Next, from time T5 to time T6, the data circuit 15 receives data DQ4 to DQ7 in synchronism with data strobe signal DQS. Data DQ4 to DQ7 are data corresponding to the long write command LWT. Data DQ4 to DQ7 are unnecessary data. As shown in FIG. 21, therefore, data mask signal DM is attached to data DQ4 to DQ7 from time T5 to time T6 (during which the data mask signal DM is at the H level). As a result, data DQ4 to DQ7 accompanying the long write command LWT are not transferred to the page buffer PB (the page buffer PB is not updated).

Thereafter, the command/address circuit 16 receives a pre-charge command, and the write is brought to an end.

FIG. 22 is a timing chart illustrating a various signals of a second example of a write performed by a semiconductor memory device according to an embodiment.

In the second example, the command/address circuit 16 receives an active command ACT at time T0, and a short write command SWT0 at time T1, as in the first example.

Subsequently, at time T2, the command/address circuit 16 receives a long write command LWT. The long write command LWT is different from a short write command and includes a bank address and a row address.

Next, from time T3 to time T4, the data circuit 15 receives data DQ0 to DQ3 in synchronism with data strobe signal DQS. Data DQ0 to DQ3 are data corresponding to the short write commands SWT0. Data DQ0 to DQ3 are data to be written in the memory cell MC and are transferred to the page buffer PB (the page buffer PB is updated thereby).

After time T4, the data circuit 15 does not receive data DQ. This is because the long write command LWT is a command that is not accompanied by data DQ. As a result, there is no data accompanying the long write command LWT, and data DQ are not transferred to the page buffer PB (the page buffer PB is not updated). A pre-charge command, for example, may be used as the long write command LWT. The pre-charge command is a command different from a short write command and is not accompanied by data DQ.

The method in which the page buffer PB is not updated by data DQ accompanying the long write command LWT is not limited to the first or second example described above. For example, data DQ accompanying the long write command LWT may be the same as data DQ accompanying the short write command SWT0. In this case, even if data DQ accompanying the long write command LWT is transferred to the page buffer PB, the data in the page buffer PB is not changed thereby, and the page buffer PB is not updated in practice.

In the second example (wherein the pre-charge command PCG is used as the long write command LWT), the data in the sense amplifier latch SAL is in the state of garbage. Therefore, the data in the sense amplifier latch SAL does not have to be updated at the end of the long write (in step S46).

Advantages of Embodiment

In an MRAM, the memory cells have magnetic characteristics, and data is written in the memory cells by supplying a current to the memory cells. Unlike a NAND flash memory, the MRAM does not gradually write data by stepping up a write voltage. Therefore, a verify operation for confirming written data is not performed.

In an MRAM according to a comparative example, a write time is determined in accordance with a cell having poorest write characteristics. In other words, a comparatively long write time is required for the memory cells of all columns. However, the write performed for a cell having good write characteristics ends in a short time. As can be seen, the write for the cell having good write characteristics undesirably continues even after data is written in the cell. If such an excessive write is performed, the write characteristics of that cell may deteriorate, and the durability of the memory cell is degraded.

In contrast, according to the present embodiment, a short write, the write time of which is short, is performed for the memory cells of all columns. Thereafter, a long write, the write time of which is long, is performed for the memory cells MC undergoing a write fail. Accordingly, data can be written in the memory cells MC having good write characteristics by the short write, and the long excessive write time is prevented. As a result, the deterioration of write characteristics is suppressed, and the durability of memory cells is improved. Furthermore, the long write, executed after the short write, enables data to be correctly written in memory cells MC having poor write characteristics. Therefore, the memory cells MC having poor write characteristics do not undergo a write fail, and data can be written in them reliably.

According to the comparative example, a write is performed for a long time for the memory cells of all columns. For this reason, the time in which the write is performed for the memory cells of one column tends to overlap the time in which the write is performed for the memory cells of another column (that is, the writes are likely to be executed in parallel). If the writes are simultaneously performed for a large number of columns, the peak current will be inevitably high, and the power consumption will increase.

In contrast, according to the present embodiment, a short write is first performed for the memory cells of all columns. Therefore, the write for the memory cells of one column and the write for the memory cells of another column are prevented from being executed in parallel. As a result, the peak current can be lowered, and the power consumption can be decreased.

In connection with the present embodiment, reference was made to the case where writes requiring two write times (namely, a short write and a long write) are performed. Needless to say, writes requiring three or more write times may be performed.

In the present embodiment, an example in which the short write command SWT is different from the long write command LWT is showed, but is not limited thereto. Even if these are the same commands, the short write and the long write may be performed by setting option with an address.

While certain embodiments have been described, these embodiments have been presented by way of example only, and are not intended to limit the scope of the claims. Indeed, the novel methods and systems described herein may be embodied in a variety of other forms; furthermore, various omissions, substitutions and changes in the form of the methods and systems described herein may be made without departing from the spirit of the embodiments. The accompanying claims and their equivalents are intended to cover such forms or modifications as would fall within the scope and spirit of the embodiments.

What is claimed is:

1. A semiconductor memory device comprising:
a first memory cell including a first variable resistive element; and
a first circuit which controls a write performed for the first memory cell,
wherein the first circuit:
performs a first write for writing first data in the first memory cell in a first time,
determines whether or not the first write fails, and
performs a second write for writing the first data in the first memory cell in a second time longer than the first time, if the first write fails, and
wherein:
the first time is determined by a first write pulse having a first pulse width, and the second time is determined by a second write pulse having a second pulse width greater than the first pulse width,
the first write pulse is generated based on rise times of a first signal and a second signal, and
the second write pulse is generated based on rise times of the first signal and a delayed signal of the second signal.

2. The device of claim 1, wherein the first circuit comprises:
a first latch which temporarily stores read data read from the first memory cell; and
a second latch which temporarily stores write data to be written in the first memory cell, and
wherein a determination of whether or not the first write fails is made by checking whether or not data in the first latch and data in the second latch are identical.

3. The device of claim 2, wherein data in the first memory cell is transferred to the first latch before the determination of whether or not the first write fails is made.

4. The device of claim 2, wherein the first write is performed in response to a first command, and the second write is performed in response to a second command different from the first command.

5. The device of claim 4, wherein second data is kept from being transferred to the second latch in the second write by generating a third signal for the second data accompanying the second command.

6. The device of claim 4, wherein the second command is a pre-charge command.

7. A semiconductor memory device comprising:
a first memory cell including a first variable resistive element;
a second memory cell including a second variable resistive element; and
a first circuit which controls a write performed for the first memory cell and the second memory cell,
wherein the first circuit:
performs a first write for writing first data in the first memory cell in a first time,
performs a second write for writing second data in the second memory cell in the first time,
determines whether or not the first write fails, and further determines whether or not the second write fails, and
performs a third write for writing the first data in the first memory cell in a second time longer than the first time if the first write fails, and further performs a fourth write for writing the second data in the second memory cell in the second time if the second write fails.

8. The device of claim 7, wherein the first time is determined by a first write pulse having a first pulse width, and the second time is determined by a second write pulse having a second pulse width greater than the first pulse width.

9. The device of claim 8, wherein:
the first write pulse is generated based on rise times of a first signal and a second signal, and
the second write pulse is generated based on rise times of the first signal and a delayed signal of the second signal.

10. The device of claim 7, wherein the first circuit comprises:
a first latch which temporarily stores read data read from the first memory cell; and
a second latch which temporarily stores write data to be written in the first memory cell, and
wherein a determination of whether or not the first write fails is made by checking whether or not data in the first latch and data in the second latch are identical.

11. The device of claim 7, wherein the first circuit comprises:
a third latch which temporarily stores read data read from the second memory cell; and
a fourth latch which temporarily stores write data to be written in the second memory cell, and
wherein a determination of whether or not the second write fails is made by checking whether or not data in the third latch and data in the fourth data are identical.

12. The device of claim 10, wherein data in the first memory cell is transferred to the first latch before the determination of whether or not the first write fails is made.

13. The device of claim 11, wherein data in the second memory cell is transferred to the third latch before the determination of whether or not the second write fails is made.

14. The device of claim 10, wherein the first write is performed in response to a first command, and the second write is performed in response to a second command different from the first command.

15. The device of claim 14, wherein third data is kept from being transferred to the second latch in the third write by generating a third signal for the third data accompanying the second command.

16. The device of claim 14, wherein the second command is a pre-charge command.

17. The device of claim 11, wherein the second write is performed in response to a third command, and the fourth write is performed in response to a fourth command different from the third command.

18. The device of claim 17, wherein fourth data is kept from being transferred to the fourth latch in the fourth write by generating a fourth signal for the fourth data accompanying the fourth command.

* * * * *